(12) United States Patent
Ahmed et al.

(10) Patent No.: US 8,009,765 B2
(45) Date of Patent: Aug. 30, 2011

(54) DIGITAL POLAR TRANSMITTER

(75) Inventors: Walid Khairy Mohamed Ahmed, Tinton Falls, NJ (US); Qing Li, Princeton Junction, NJ (US); Ajit Kumar Reddy, Matawan, NJ (US); Eoin Carey, Cork (IE)

(73) Assignee: Pine Valley Investments, Inc., Las Vegas, NV (US)

( * ) Notice: Subject to any disclaimer, the term of this patent is extended or adjusted under 35 U.S.C. 154(b) by 790 days.

(21) Appl. No.: 12/048,022

(22) Filed: Mar. 13, 2008

(65) Prior Publication Data

US 2008/0225984 A1    Sep. 18, 2008

Related U.S. Application Data

(60) Provisional application No. 60/906,924, filed on Mar. 13, 2007.

(51) Int. Cl.
H04K 1/02    (2006.01)
(52) U.S. Cl. ......................................... 375/297
(58) Field of Classification Search ........... 375/295–297
See application file for complete search history.

(56) References Cited

U.S. PATENT DOCUMENTS

| | | |
|---|---|---|
| 4,630,315 A | 12/1986 | Watkinson |
| 5,524,286 A | 6/1996 | Chiesa et al. |
| 5,598,436 A | 1/1997 | Brajal et al. |
| 5,745,527 A | 4/1998 | Kelton et al. |
| 5,905,760 A | 5/1999 | Schnabl et al. |
| 6,043,707 A | 3/2000 | Budnik |
| 6,101,224 A | 8/2000 | Lindoff et al. |
| 6,125,266 A | 9/2000 | Matero et al. |
| 6,147,553 A | 11/2000 | Kolanek |
| 6,449,465 B1 | 9/2002 | Gailus et al. |
| 6,600,369 B2 | 7/2003 | Mitzlaff |
| 6,621,340 B1 | 9/2003 | Perthold et al. |
| 6,650,691 B2 | 11/2003 | Cramer, III |
| 6,701,134 B1 | 3/2004 | Epperson |
| 6,735,419 B2 | 5/2004 | Mitzlaff |
| 6,834,084 B2 | 12/2004 | Hietala |
| 6,834,183 B2 | 12/2004 | Black et al. |
| 6,844,788 B2 | 1/2005 | Chadwick |
| 6,850,574 B2 | 2/2005 | Schwent et al. |
| 6,937,874 B2 | 8/2005 | Cramer, III |
| 7,012,970 B2 | 3/2006 | Greenwood et al. |
| 7,020,215 B2 | 3/2006 | Porco et al. |
| 2002/0090921 A1 | 7/2002 | Midtgaard et al. |
| 2002/0098812 A1 | 7/2002 | Sourour et al. |
| 2002/0186783 A1 | 12/2002 | Opas et al. |
| 2002/0193085 A1 | 12/2002 | Mathe et al. |

(Continued)

*Primary Examiner* — Don N Vo
(74) *Attorney, Agent, or Firm* — Allen, Dyer, Doppelt, Milbrath & Gilchrist, P.A.

(57) ABSTRACT

A digital polar transmitter includes a baseband processor configured to receive an input signal and to convert the input signal into a baseband amplitude component and a baseband phase component. The transmitter also includes a phase modulator in communication with the baseband processor. The phase modulator is configured to modulate an RF carrier signal based on the phase component and to generate a phase-modulated RF carrier signal. A power amplifier is provided in communication with the baseband processor and the phase modulator. The power amplifier is configured to amplify the phase-modulated RF carrier signal based on the baseband amplitude component and to generate an amplified RF signal. The transmitter also includes a digital feedback loop in communication with the power amplifier and the baseband processor. The digital feedback loop is configured to detect the amplified RF signal and to provide a digital amplitude feedback signal and a detected phase feedback signal to the baseband processor.

12 Claims, 9 Drawing Sheets

U.S. PATENT DOCUMENTS

| | | |
|---|---|---|
| 2002/0196864 A1 | 12/2002 | Booth et al. |
| 2003/0073419 A1 | 4/2003 | Chadwick |
| 2003/0095608 A1 | 5/2003 | Duperray |
| 2003/0215025 A1 | 11/2003 | Hietala |
| 2003/0215026 A1 | 11/2003 | Hietala |
| 2004/0021517 A1 | 2/2004 | Irvine et al. |
| 2004/0047432 A1 | 3/2004 | Iwasaki |
| 2004/0192369 A1 | 9/2004 | Nilsson |
| 2004/0198257 A1 | 10/2004 | Takano et al. |
| 2004/0208157 A1 | 10/2004 | Sander et al. |
| 2004/0212445 A1 | 10/2004 | Haglan |
| 2004/0219891 A1 | 11/2004 | Hadjichristos |
| 2004/0252785 A1* | 12/2004 | Demir et al. ................ 375/297 |
| 2004/0263245 A1 | 12/2004 | Winter et al. |
| 2005/0017801 A1 | 1/2005 | Bachman, II et al. |
| 2005/0064830 A1 | 3/2005 | Grigore |
| 2005/0110565 A1 | 5/2005 | Robinson |
| 2005/0110568 A1 | 5/2005 | Robinson et al. |
| 2005/0118965 A1 | 6/2005 | Tanabe et al. |
| 2005/0122164 A1 | 6/2005 | Brandt et al. |
| 2005/0122166 A1 | 6/2005 | Premakanthan et al. |
| 2005/0130609 A1 | 6/2005 | Nagode et al. |
| 2005/0134396 A1 | 6/2005 | Pehlke et al. |
| 2005/0190854 A1 | 9/2005 | Shakeshaft et al. |
| 2005/0191976 A1 | 9/2005 | Shakeshaft et al. |
| 2006/0109930 A1* | 5/2006 | O'Sullivan et al. ........... 375/296 |
| 2006/0128324 A1 | 6/2006 | Tan et al. |
| 2007/0142000 A1* | 6/2007 | Herzinger ...................... 455/91 |
| 2010/0290562 A1* | 11/2010 | Jensen et al. ................. 375/300 |
| 2010/0330913 A1* | 12/2010 | Zolfaghari ..................... 455/42 |

* cited by examiner

DIGITAL POLAR TRANSMITTER

CLAIM OF PRIORITY

This application claims the benefit of the U.S. provisional application 60/906,924, filed on Mar. 13, 2007, which is hereby incorporated by reference.

FIELD OF THE INVENTION

This invention relates to wireless transmission, and specifically to digital polar transmission.

BACKGROUND OF THE INVENTION

Polar modulation is a technique where a signal, or carrier, having constant radian frequency ω, is time-varied in both magnitude and phase. Polar modulation transmitters transmit information that both the magnitude (R) and the phase (θ) of a signal carry simultaneously. There are many benefits to using polar modulation to transmit information, particularly for wireless handset transmitter designs. Polar transmitters may receive baseband signals represented in Cartesian form as an in-phase (I) component and a quadrature (Q) component. An IQ baseband signal may be converted to polar form in terms of its magnitude R and phase θ signals. The magnitude R is referred to as the amplitude component, or amplitude signal, and the phase θ is referred to as the phase component, or phase signal. A coordinate rotation digital computer (CORDIC) algorithm may be employed to convert the IQ baseband signals to polar form amplitude R and phase θ signals. The amplitude R and phase θ signals may be processed in separate amplitude and phase paths and may be recombined at the output of the power amplifier. The IQ components may be reconstructed by additional processing downstream of the power amplifier output.

Polar modulation techniques allow a nonlinear device, such as a power amplifier, to operate in the saturation (nonlinear) region with higher power efficiency and longer battery lifetime. As wireless phone standards evolve from 2G to 3G and beyond, for example, EDGE (Enhanced Data GSM Environment) and UMTS (Universal Mobile Telecommunications System), the demand for non-constant envelope modulation using a polar transmitter is growing rapidly. This is due in part to the potential for benefits in terms of hardware, power savings, and multi-mode flexibility. Nonlinear devices may be used for this type of polar transmission.

In nonlinear devices, waveform quality typically increases with a more linear output response. However, some nonlinear devices operate more efficiently when the output response is nonlinear—for example, when a power amplifier approaches saturation. As a result, there is often a tradeoff between waveform quality and efficiency. For example, when a nonlinear device approaches saturation or starts to exhibit nonlinear qualities (which may improve efficiency), the waveform quality may be degraded and may not meet the specific requirements and standards. Alternatively, if nonlinear devices are set to operate in linear regions to meet quality standards or requirements, then power consumption and current drain may be degraded because the device is operating at a lower efficiency level.

Correction of the nonlinearity of the power amplifier becomes extremely challenging as the polar modulation technique is applied to non-constant envelope modulation. Two primary approaches exist: open-loop correction and closed-loop error-based correction. Open-loop correction, which typically involves a lookup table (LUT) is relatively simple, but needs significant manufacturing calibration for collecting tables or calculating the coefficients, and suffers performance loss if the device nonlinearity varies once out of the manufacturing environment and the pre-collected tables or pre-calculated coefficients are no longer accurate enough. On the other hand, error-based closed-loop correction, either adaptive or non-adaptive, may fail to deliver accurate correction to severe nonlinearities, especially for a high gain loop with large delay. Thus, there is a need for a reliable and efficient digital polar transmitter.

BRIEF SUMMARY

According to one aspect of the invention, there is a digital polar transmitter. The transmitter includes a baseband processor configured to receive an input signal and to convert the input signal into a baseband amplitude component and a baseband phase component. The transmitter also includes a phase modulator in communication with the baseband processor. The phase modulator is configured to modulate an RF carrier signal based on the phase component and to generate a phase-modulated RF carrier signal. A power amplifier is provided in communication with the baseband processor and the phase modulator. The power amplifier is configured to amplify the phase-modulated RF carrier signal based on the baseband amplitude component and to generate an amplified RF signal. The transmitter also includes a digital feedback loop in communication with the power amplifier and the baseband processor. The digital feedback loop is configured to detect the amplified RF signal and to provide a digital amplitude feedback signal and a digital phase feedback signal to the baseband processor.

Other systems, methods, features and advantages of the nonlinear feedback control system will be, or will become, apparent to one with skill in the art upon examination of the following figures and detailed description. It is intended that all such additional systems, methods, features and advantages be included within this description.

BRIEF DESCRIPTION OF THE DRAWINGS

The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PRESENTLY PREFERRED EMBODIMENTS

The term "signal," as used herein, should be broadly construed to include any manner of conveying data from one place to another, such as, for example, an electric current or electromagnetic field, including without limitation, a direct current that is switched on and off or an alternating-current or electromagnetic carrier that contains one or more data streams. Data, for example, may be superimposed on a carrier current or wave by means of modulation, which may be accomplished in analog or digital form. The term "data" as used herein should also be broadly construed to comprise any type of intelligence or other information, such as, for example and without limitation, audio, video, and/or text information.

Figure 1:
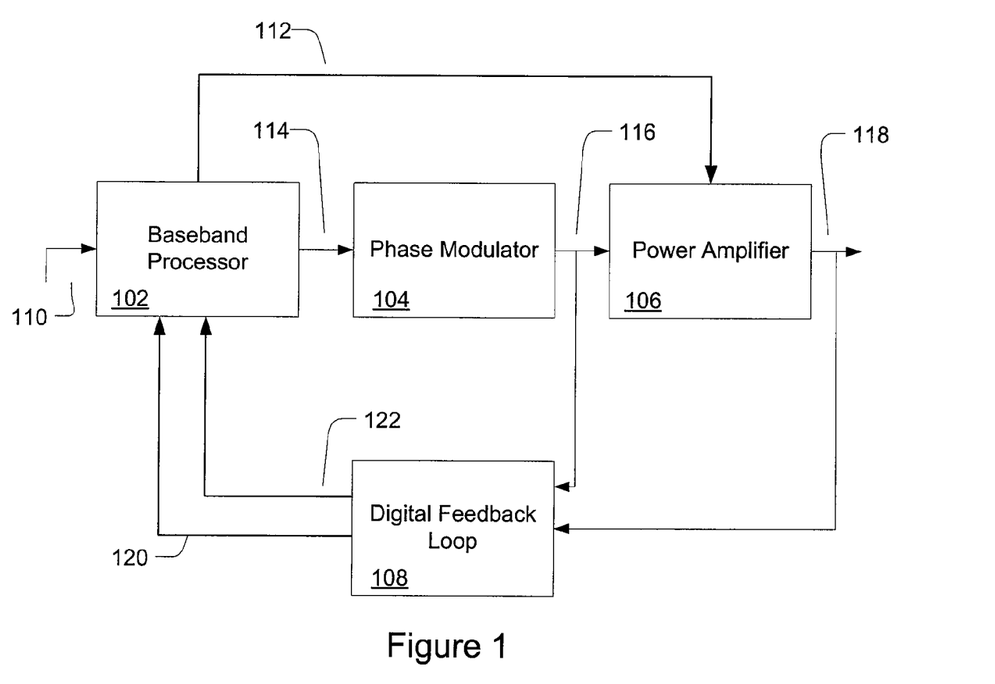
FIG. 1 is a block diagram of a digital polar transmitter according to one aspect of the invention.

FIG. 1 is a block diagram of a digital polar transmitter 100. The transmitter 100 includes a baseband processor 102, a phase modulator 104, a power amplifier module 106, and a digital feedback loop 108.

The baseband processor 102 receives a digital input signal 110. For example, the digital input signal 110 may come from a baseband modem (not shown), such as a GSM/EDGE baseband modem. The digital input signal 110 may include a series of digital symbols, such as GSM or EDGE symbols. The incoming signal may be represented in a rectangular format as an in-phase (I) component and a quadrature (Q) component. The baseband processor 102 converts the input signal 110 into a polar format, including a baseband amplitude component 112 and a baseband phase component 114. The baseband processor 102 also may pre-distort the baseband amplitude component 112 and the baseband phase component 114 to compensate for nonlinearities in the transmitter 100. For example, the pre-distortion may be designed to compensate for nonlinearities in the power amplifier 106. The baseband processor also may be configured to synchronize the baseband amplitude and phase components 112, 114. For example, the synchronization may compensate for subtle differences in propagation delays between the amplitude and phase paths of the transmitter 100.

The phase modulator 104 modulates a radio-frequency (RF) carrier signal based on the baseband phase component 114 to generate a phase-modulated RF carrier signal 116. For example, the phase modulator may map the baseband phase component 114 into IQ format, convert it to analog phase IQ signals, and smooth the signals using low-pass filtering. Because the signal 116 is primarily phase-modulated, it has a nearly constant amplitude envelope.

The power amplifier module 106 receives the phase-modulated RF carrier signal 116 and amplifies it based on the baseband amplitude component 112. For example, the baseband amplitude component 112 may be used to bias the power amplifier 106, which effectively combines the phase-modulated RF carrier signal 116 and the baseband amplitude component 112 to generate an amplified RF signal 118.

The digital feedback loop 108 provides digital feedback information from the phase modulator 104 and/or the power amplifier module 106 to the baseband processor 102. For example, as shown in FIG. 1, the digital feedback loop receives the phase-modulated RF carrier signal 116 from the phase modulator 104. The digital feedback loop 108 also receives the amplified RF signal 118 from the power amplifier 106. Based on these signals, the digital feedback loop 108 detects the actual amplitude and phase of the amplified RF signal 118. For example, the digital feedback loop 108 may down-convert the amplified RF signal to baseband analog IQ components, correct the analog IQ components for DC offset, and convert the IQ components to digital format. The digital IQ components may be further adjusted with IQ imbalance correction and digital DC offset correction. The digital feedback loop 108 may then convert the digital IQ components to a polar format including a digital feedback amplitude component 120 and a digital feedback phase component 122. The digital feedback loop 108 provides these polar feedback components 120, 122 to the baseband processor 102, which uses them to correct for amplitude and phase errors caused by nonlinearities in the various components of the transmitter 100, particularly the power amplifier 106.

Figure 2:
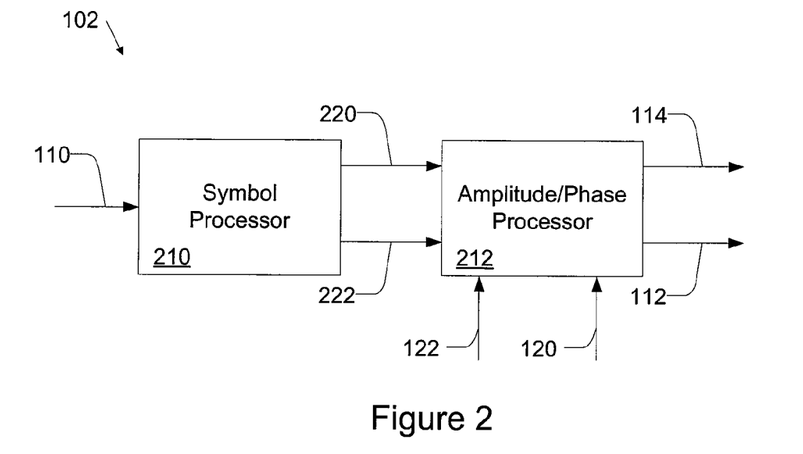
FIG. 2 is a block diagram of a baseband processor for use with a digital polar transmitter according to another aspect of the invention.

FIG. 2 is a block diagram of a baseband processor 102 for use with a digital polar transmitter according to another aspect of the invention. The baseband processor 102 includes a symbol processor 210 and an amplitude/phase processor 212. The symbol processor receives digital data symbols 110 and processes the symbols 110 into original baseband phase and amplitude signals 220, 222. For example, the symbol processor 210 may modulate the digital data symbols 110 in a rectangular coordinate format to form IQ signals using 8-phase shift keying (8PSK) for EDGE. Other modulation techniques may be used, such as the Gaussian minimum-shift keying (GMSK) techniques used for GSM, or other techniques. In addition, when processing for the EDGE standard, the symbol processor 210 may insert augmented symbols during the ramp-up and ramp-down portions of a symbol burst to satisfy the required power level, as described in more detail below.

The amplitude/phase processor 212 receives the original baseband phase and amplitude signals 220, 222 and further processes these signals to generate pre-distorted baseband amplitude and phase signals 112, 114. This further processing is based in part on the amplitude and phase feedback components 120, 122 received from the digital feedback loop, as described in more detail below.

Figure 3:
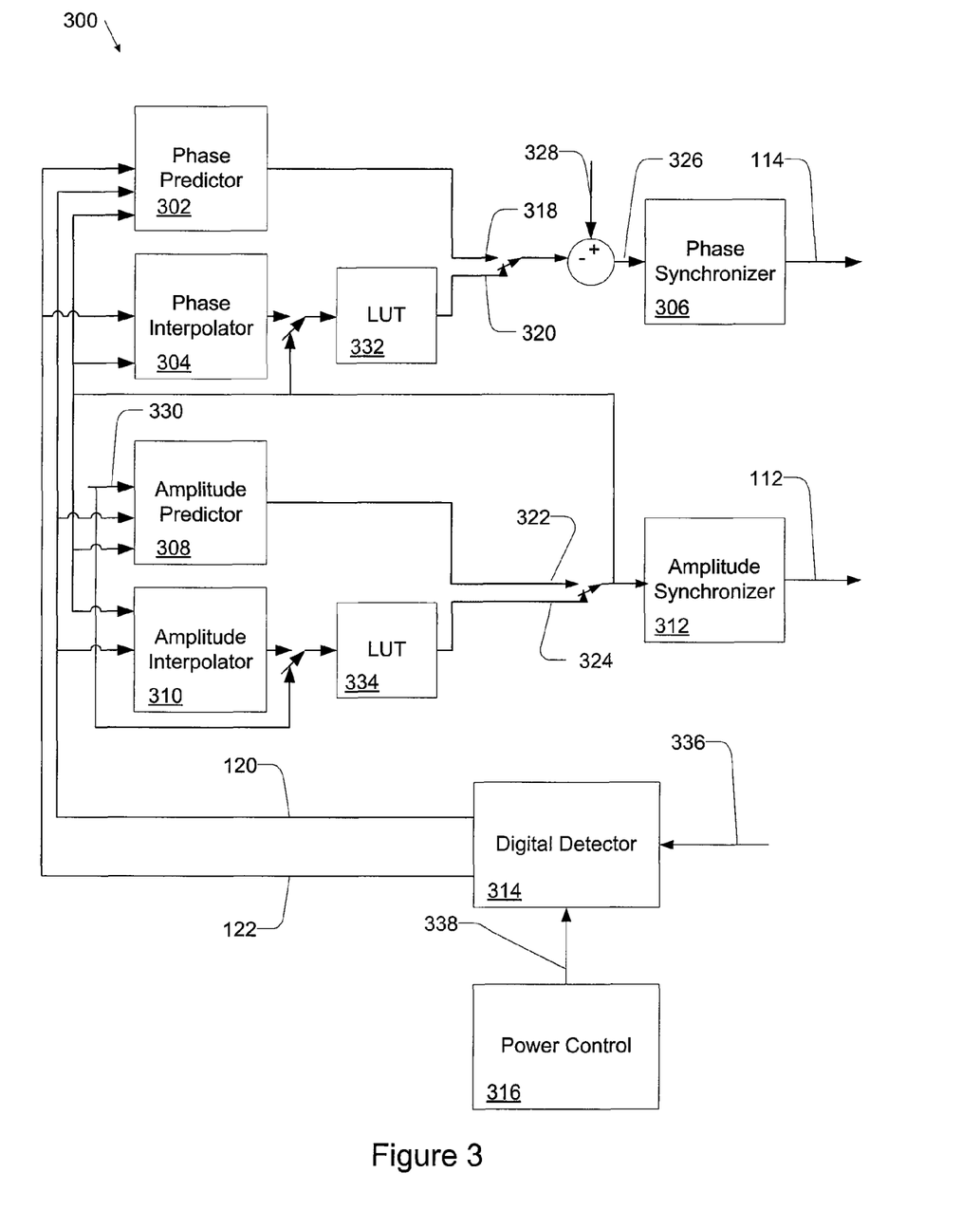
FIG. 3 is a block diagram of a digital synchronization, power control, calibration, and mask compliance system for use with a digital polar transmitter according to another aspect of the invention.

FIG. 3 is a block diagram of a digital synchronization, power control, calibration, and mask compliance (SPCM) system 300 for use with a digital polar transmitter according to another aspect of the invention. The SPCM system 300 may be used with the digital polar transmitter 100 of FIG. 1. For example, the SPCM system 300 may be part of the baseband processor 102. In particular, portions of the SPCM system 300 may be implemented as part of the amplitude/phase processor 212. Portions of the SPCM system 300 also may be implemented as part of the digital feedback loop 108.

The system 300 includes a phase predictor 302, a phase interpolator 304, and a phase synchronizer 306. The system 300 also includes an amplitude predictor 308, an amplitude interpolator 310, and an amplitude synchronizer 312. Also included in the system 300 are a digital detector 314 and power control module 316.

The SPCM system 300 may be configured to perform a variety of functions related to amplitude and phase correction, or pre-distortion. The system 300 may perform closed-loop predictive correction of the amplitude and phase to correct for nonlinearities in the transmitter 100 or other devices. The SPCM system 300 also may be configured to construct amplitude and phase correction lookup tables 334, 332. For example, the system 300 may construct these lookup tables 334, 332 during a calibration period or ramp-up of the transmitter. The SPCM system also may be configured to perform open-loop amplitude and phase correction based on these lookup tables. In this open-loop mode, the phase and amplitude predictors and interpolators 302, 304, 308, 310 may be disabled to conserve power.

The phase predictor 302 and amplitude predictor 308 may be configured to provide closed-loop phase and amplitude correction signals 318, 322, respectively, based on predicted changes in the phase or amplitude of the transmitter output. The predictions may be based, for example, on signals provided by the digital detector 314. The phase correction signal 318 and the amplitude correction signal 322 effectively pre-distort the baseband phase and amplitude components 112, 114 to provide a desired linear output from the power amplifier 106.

The phase interpolator 304 and amplitude interpolator 310 may be configured to build baseband amplitude and phase correction lookup tables 334, 332 by interpolating pre-distortion values or parameters based on feedback from the digital detector 314 and other inputs. For example, the phase and amplitude interpolators 304, 310 may construct these lookup tables 332, 334 based on information from the digital detector 314 and/or the phase and amplitude predictors 302, 308, during a calibration period or ramp-up of the transmitter. During the buildup period, the lookup tables 332, 334 are connected to the phase and amplitude interpolators 304, 310, respectively. In addition, the phase and amplitude correction lookup tables 332, 334 may be configured to provide open-loop phase and amplitude correction signals 320, 324, respectively. During this open-loop operation, the amplitude lookup table 334 is driven by the original baseband amplitude component 330, and the phase lookup table 332 is driven by the output from the amplitude lookup table 334.

Depending on the mode of operation (closed-loop or open-loop), either the phase predictor 302 or the lookup table 332 provides a phase correction signal 318, 320. The phase correction signal 318 is a pre-distortion parameter that is subtracted from the original baseband phase signal 328. The resulting signal is then synchronized by phase synchronizer 306 to generate the pre-distorted baseband phase component 114. Likewise, either the amplitude predictor 308 or the lookup table 334 provides an amplitude correction signal 322, 324, which is a pre-distorted amplitude signal. This signal is then synchronized by the amplitude synchronizer 312 to generate the pre-distorted baseband amplitude component 112.

The digital detector 314, which may be part of the digital feedback loop 108 shown in FIG. 1, receives digital IQ signals 336 from other components of the digital feedback loop 108. Based on these digital IQ signals, the digital detector 314 generates the detected amplitude signal 120 and the detected phase signal 122. As discussed above, the original feedback signal may be attenuated, down-converted, corrected for analog DC offset, amplified, and converted to the digital IQ signals 336. The digital detector 314 balances and corrects the IQ signals for digital DC offset, and then converts the digital IQ signals 332 into the detected amplitude signal 120 and the detected phase signal 122. For a desired power setting, the digital detector 314 may scale the detected amplitude signal 120 by a suitable gain value 338 received from the power control module 316. The conversion of the digital IQ signals 336 into the detected amplitude and phase signals 120, 122 may be accomplished using CORDIC algorithm or suitable rectangular-to-polar conversion technique. The power control module 316 also may control and define values (not shown) for attenuation and analog gain in other portions of the digital feedback loop 108, as well as dynamic range scaling for a multiplying digital to analog converter (not shown).

The phase predictor 302 receives the detected amplitude and phase signals 120, 122 from the digital detector 314. The phase predictor 302 also receives the amplitude correction signal 322 from the amplitude predictor 308. The phase predictor 302 uses these signals to generate the phase correction signal 318.

The amplitude predictor 308 receives the original baseband amplitude signal 330, the detected amplitude signal 120 from the digital detector 314, and the amplitude correction signal 322 from the amplitude predictor 308. The amplitude predictor 308 uses these signals to generate the amplitude correction signal 322. The operation of the phase and amplitude predictors 302, 308 is discussed in more detail below.

The phase interpolator 304 receives the phase detection signal 122 from the digital detector 314, and the amplitude correction signal 322 from the amplitude predictor 308. The phase interpolator 304 uses these signals to build up the phase correction lookup table and/or to generate the phase correction signal 320. Similarly, the amplitude interpolator 310 receives the amplitude detection signal 120 from the digital detector 314 and the amplitude correction signal 322, 324 from either the amplitude predictor 308 or the lookup table 334, depending on whether the operation is closed-loop or open loop. The amplitude interpolator 310 uses these signals to build up the amplitude correction lookup table and/or to generate the amplitude correction signal 324. The operation of the phase and amplitude interpolators 304 and 310 is discussed in more detail below.

Figure 4:
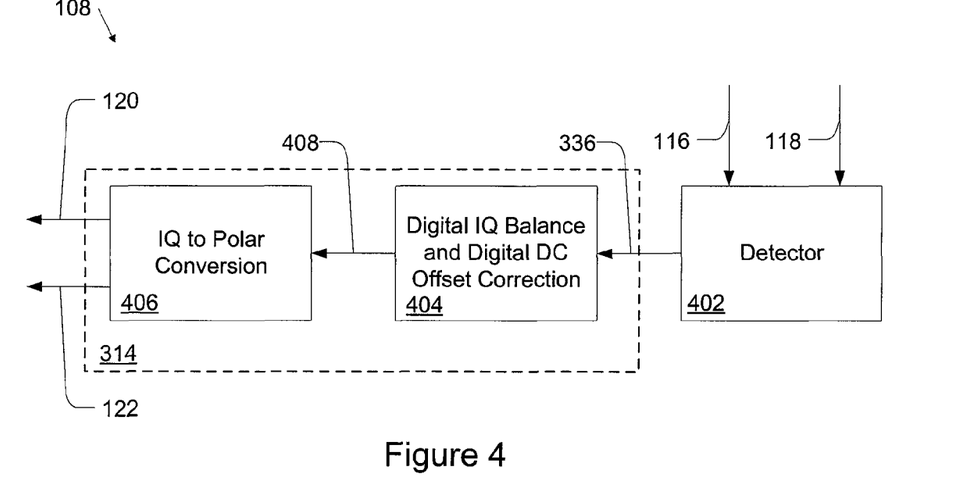
FIG. 4 is a block diagram of a digital feedback loop for use with a digital polar transmitter according to another aspect of the invention.

FIG. 4 is a block diagram of the digital feedback loop 108 for use with a digital polar transmitter according to another aspect of the invention. The digital feedback loop 108 includes a detector 402, a digital IQ balance and digital DC offset correction block 404, and an IQ to polar converter 406. The detector 402 receives the phase-modulated RF carrier signal 116 and amplified RF signal 118. The detector 402 attenuates, down-converts, corrects for analog DC offset, and amplifies these signals. The detector 402 also converts the signals 116 and 118 to the digital IQ signals 336 described above. Sub-sampling or other techniques may be utilized in the detector 402 to process and down-convert the amplified RF signal 118 prior to conversion into the digital IQ signals 336.

The digital detector 314 of FIG. 3, which converts digital IQ signals 336 into the amplitude and phase feedback components 120, 122, includes block 404 and converter 406. Block 404 receives the digital IQ signals 336, balances the signals 336, and DC offset corrects the signals 336 to generate intermediate IQ signals 408. The IQ to polar converter 406 then converts the intermediate IQ signals 408 into the amplitude and phase feedback components 120, 122. A CORDIC algorithm or other known rectangular-to-polar conversion techniques may be used to convert the digital IQ signals 336 into feedback signal components 120, 122.

Figure 5:
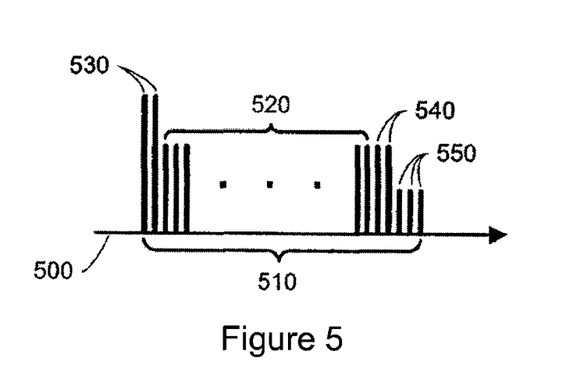
FIG. 5 is a timing diagram illustrating an augmented EDGE data burst according to another aspect of the invention.
Figure 6:
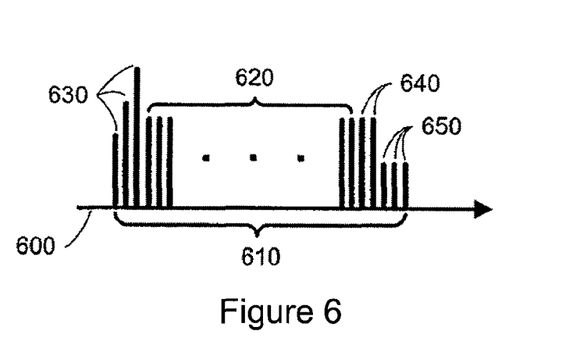
FIG. 6 is a timing diagram illustrating an augmented EDGE data burst according to another aspect of the invention.
Figure 7:
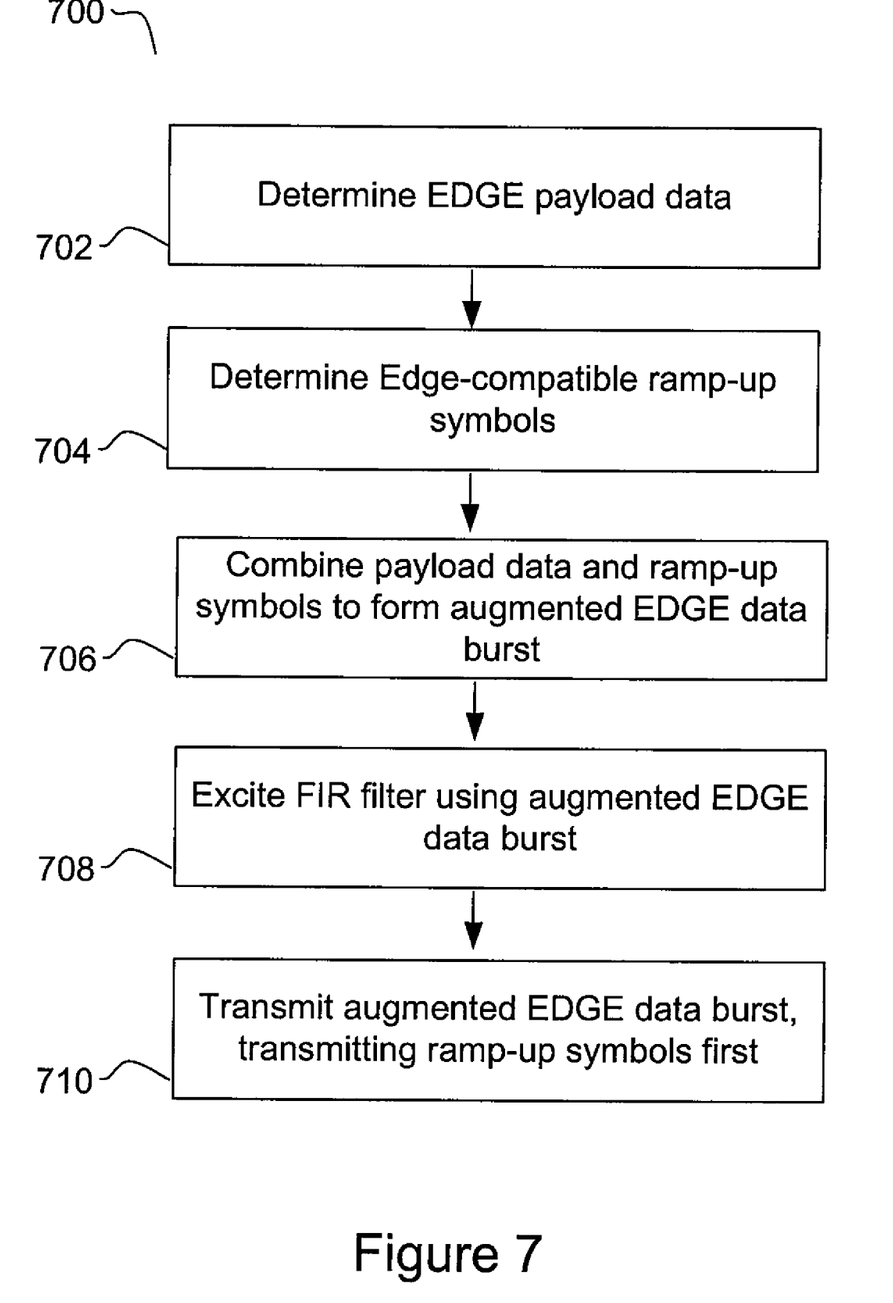
FIG. 7 is a flow diagram illustrating a method of generating an augmented EDGE data burst for radio frequency transmission on an EDGE channel between a wireless communication device and a network according to another aspect of the invention.

FIGS. 5, 6, and 7 illustrate power ramp-up and ramp-down operations of the digital polar transmitter 100. In particular, these figures illustrate the generation of augmented EDGE data bursts by the symbol processor 210.

FIG. 5 is a timing diagram illustrating an augmented EDGE data burst 510 according to another aspect of the invention. The augmented EDGE data burst 510 includes augmented symbols, which may be inserted by the symbol processor 210 described above. The EDGE data burst 510 comprises a series of ramp-up symbols 530, payload data symbols 520 from the digital data symbols 110, ramp-down symbols 540, and termination symbols 550. In FIG. 5, the typical 8PSK symbols of the EDGE standard are illustrated as impulses on the timeline 500. The payload data symbols 520 are shown in the middle of the augmented EDGE data burst 510. A normal duration EDGE data burst typically includes 147 8PSK payload data symbols 520. (For convenience, only a small number of the payload data symbols are illustrated in FIG. 5.)

In the augmented EDGE data burst 510 illustrated in FIG. 5, the ramp-up symbols 530 is shown as two 8PSK symbols preceding the payload data symbols 520. These two symbols 530 provide a desired "overshoot" before the payload data symbols, which enables calibration of the amplitude/phase processor 212. Although it is not required, at least one of the ramp-up symbols 530 preferably is of the maximum magnitude permitted by the system. This helps to ensure proper calibration.

As illustrated, the two of the ramp-up symbols 530 are of equal magnitude, although the symbols also could have varying magnitudes, consistent with the switching transient constraints of the EDGE standard. Although the ramp-up symbols are shown to include only two 8PSK symbols, it may include more or less symbols consistent with the data burst time mask imposed by the EDGE standard.

As an example, the two 8PSK ramp-up symbols 530 may be two symbols of the form $s_1 = a_1 + jb_1$. The coefficients $a_1$ and $b_1$ may be selected for each symbol according to the desired set of ramp-up symbols for a given application. The symbols may be, but need not be, rotated in the manner that payload data symbols are rotated according to the EDGE standard. In addition, the ramp-up symbols may constitute a series of digital signal samples selected to produce a radio-frequency signal that meets the desired criteria after being masked by a FIR filter.

The augmented EDGE data burst 510 illustrated in FIG. 5 also includes two ramp-down symbols 540 and three termination symbols 550. If desired or needed, these symbols may be included in the augmented EDGE data burst to satisfy requirements such as the average power or switching transient constraints of the EDGE standard.

FIG. 6 is a timing diagram illustrating another augmented EDGE data burst 610 according to another aspect of the invention with augmented symbols inserted by the symbol processor 210. The augmented data burst 610 shown in FIG. 6 includes a set of ramp-up symbols consisting of three 8PSK symbols 630 of increasing magnitude. Again, these three symbols 630 provide a desired "overshoot" before the payload data symbols, which enables calibration of the amplitude/phase processor 212. Although it is not required, at least one of the ramp-up symbols preferably is of the maximum magnitude permitted by the system, which helps to ensure proper calibration.

As illustrated, the three ramp-up symbols 630 are of increasing magnitude, although the symbols also could have equal, decreasing, or otherwise varying magnitudes, consistent with the switching transient constraints of the EDGE standard. In addition, although ramp-up symbols are shown to include three 8PSK symbols, it may include more or less symbols consistent with the data burst time mask imposed by the EDGE standard.

Like the ramp-up symbols 530 illustrated in FIG. 5, the two 8PSK ramp-up symbols 530 may be two symbols of the form $s_1 = a_1 + jb_1$, with coefficients $a_1$ and $b_1$ selected for each symbol according to the desired set of ramp-up symbols for a given application. In addition, the symbols may be, but need not be, rotated in the manner that payload data symbols are rotated according to the EDGE standard. Also, the ramp-up symbols may constitute a series of digital signal samples selected to produce a radio-frequency signal that meets the desired criteria after being masked by a FIR filter.

The other aspects of the augmented EDGE data burst 610, including the timeline 600, the payload data burst symbols 620, the ramp-down symbols 640, and the termination symbols 650, are similar to those discussed above with respect to FIG. 5.

Turning now to FIG. 7, the flow diagram illustrates a method 700 of generating an augmented EDGE data burst for radio-frequency transmission between a wireless communication device and a network according to another aspect of the invention. A plurality of payload data to be transmitted is identified 702. The payload data may be identified in various ways. For example, the payload data may be received from a source for transmission, such as the digital data symbols 110, or it may be generated by the transmitter itself. In the case of an EDGE transmitter, the payload data typically would take the form of 8PSK symbols in accordance with the EDGE standard.

A set of ramp-up symbols also is determined 704. The ramp-up symbols may be selected or calculated to meet desired calibration or power criteria, depending on the particular modulation protocol and communication network. The ramp-up symbols may take various forms, including a series of digital signal samples or a series of 8PSK symbols. Regardless of whether the ramp-up symbols are a series of digital signal samples or 8PSK symbols, they may be selected to produce a radio-frequency signal that meets the desired criteria, as discussed above, after being masked by a FIR filter.

The payload data and the ramp-up symbols are combined 706 to form an augmented EDGE data burst according to another aspect of the invention. The augmented EDGE data burst also may include other desired signals or information. The augmented EDGE data burst is filtered 708 using an FIR filter to produce a radio-frequency version of the augmented EDGE data burst. For example, the modulated symbols and/or digital signal samples of the augmented EDGE data burst may be used to excite the FIR filter to produce a radio-frequency version of the augmented EDGE data burst for transmission. The augmented EDGE data burst is transmitted 710 in radio-frequency form, with the ramp-up symbols being transmitted prior to the payload data.

Figure 8:
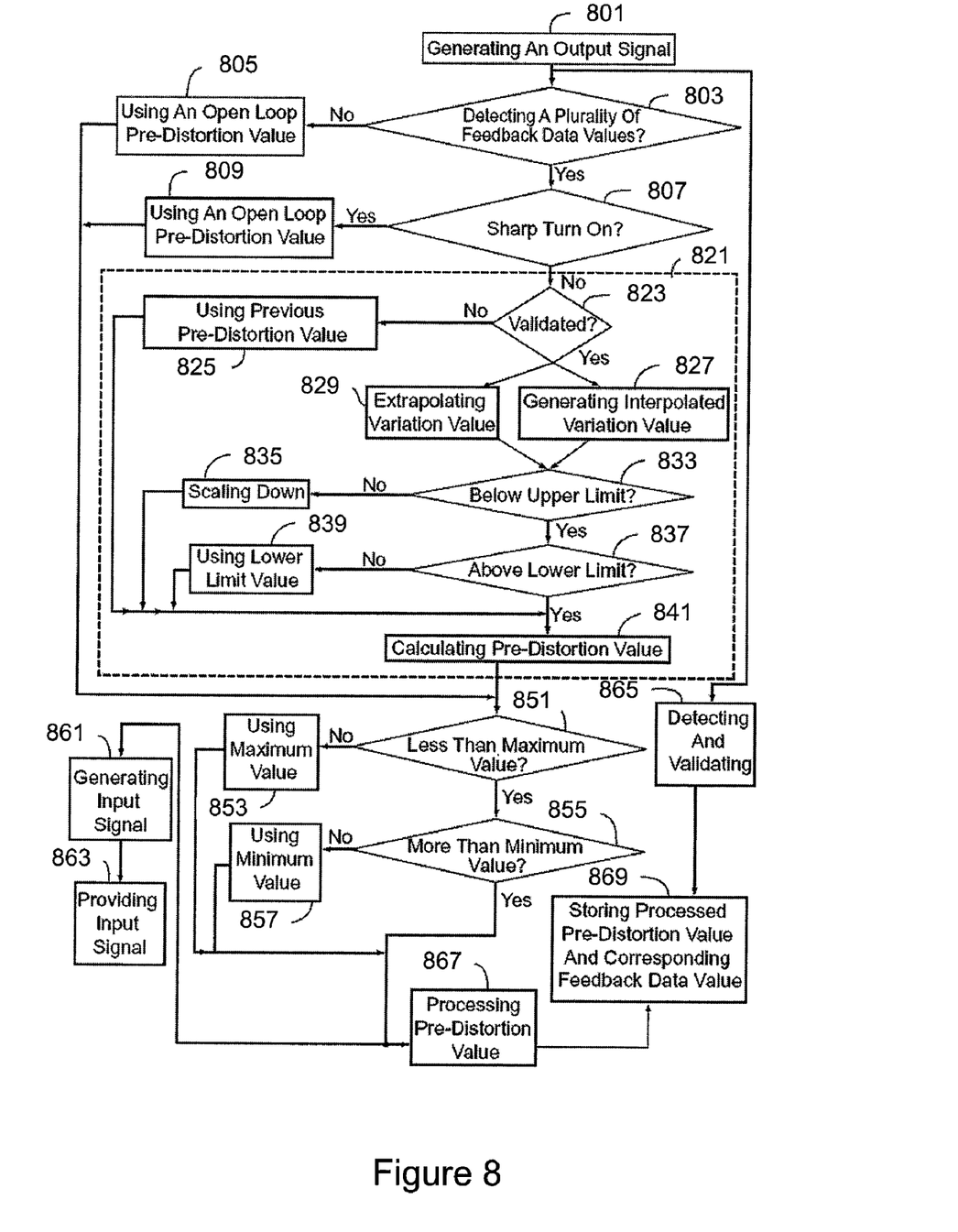
FIG. 8 is a method for pre-distorting a nonlinear device, utilizing a predictor according to another aspect of the invention.

FIG. 8 is a flow diagram illustrating operation of a predictor for pre-distorting a nonlinear device, such as a power amplifier for use with a digital polar transmitter, according to another aspect of the invention. For example, this operation may be used with the phase predictor 302 and/or the amplitude predictor 308 described above. In FIG. 8, for example, the nonlinear device generates an output signal, as in block 801. Then the function of detecting a plurality of feedback data values, d(k), such as at least two feedback data values, occurs, as in block 803. If the plurality of feedback data values is not detected, which may occur due to loop delay, then an open loop pre-distortion value, which is generated from a predefined pre-distortion function or pre-load table, is used, as in block 805. The open loop pre-distortion value is then sent to a checking block 851, bypassing block 821. If the plurality of feedback data values, d(k), is detected, then the feedback data values are checked for a sharp turn-on, as in block 807. If the feedback data values are below a specified turn-on threshold, then an open loop pre-distortion value, which is generated from a predefined pre-distortion function or pre-load table, is used, as in block 809. Being below the specified turn-on threshold means that a sharp turn-on exists. The open loop pre-distortion value is then sent to the checking block 851, bypassing block 821. If the feedback data values are above a specified turn on threshold, then a validating function will occur, as in block 823.

The validating function includes, but is not limited to, comparing the noise level of the feedback data values, d(k), with a threshold noise level. If the noise level of a certain number of the plurality of feedback data values, such as at least one, is above the threshold noise level, then those feedback data values will be discarded and a previous variation value that was extrapolated or interpolated, v(k−1), will be used, as in block 825, to be sent to a calculating pre-distortion value block 841. However, if the noise level of a certain number of the plurality of feedback data values, d(k), is below the threshold noise level, then a variation value, v(k), is extrapolated using the feedback data values, d(k), if the expected output signal value is beyond a range of feedback data values already detected, as in block 829. Other mathematical values, in addition to the feedback data values, may be used for the extrapolation. Alternatively, a variation value is interpolated from stored feedback data values and stored processed pre-distortion values if the expected output signal value is within a range of feedback data values already detected, as in block 827.

An extrapolated variation value or an interpolated variation value is checked to see if its value is above a certain upper limit, as in block 833. If the variation value is above the upper limit, the system may be noisy and unstable. If the variation value is not less than the upper limit, then the variation value is scaled down, as in block 835, and is used to calculate a pre-distortion value, as in block 841. If the variation value is less than the upper limit, then it is checked to see if it is more than a lower limit, as in block 837. If the variation value is not more than the lower limit, then the lower limit value is used, as in block 839, to calculate a pre-distortion value, as in block 841. If the variation value is more than the lower limit, then it is used for calculating the pre-distortion value, as in block 841.

Then the pre-distortion value is checked to see if it is less than a maximum value, as in block 851. If it is not, then the maximum value is used, as in block 853, to be sent to block 861, as well as block 867 if the pre-distortion value was calculated in block 841. If the pre-distortion value is less than the maximum value, then it is checked to see if it is more than a minimum value, as in block 855. If it is not, then the minimum value is used, as in block 857, to be sent to block 861, as well as block 867 if the pre-distortion value was calculated in block 841. The maximum and minimum values may vary based on hardware limitations. Furthermore, if the pre-distortion value is more than the minimum value, then it is smoothed, by averaging and filtering, and used to generate an input signal, as in block 861. The input signal, which may be a pre-distortion phase or amplitude, is provided to the nonlinear device, as in block 863. Also, if a pre-distortion value was sent to block 867, then it will be processed.

The processing may entail filtering as well as delaying the pre-distortion value, p(k), to correspond with an appropriate feedback data value, d(k). Also, the function of detecting, similar to block 803, and validating, similar to block 823, a plurality of feedback data values, d(k), occurs, as in block 865. Then a feedback data value and a corresponding processed pre-distortion value, which is substantially the digital representation of the input signal, x(k), are stored in a lookup-table, as in block 869. Any one of a variety of numerical techniques can be used for the extrapolation or interpolation of the variation value, v(k), and the calculation of the pre-distortion value, p(k), as well as other math computations discussed above. For example, Spline, Cubic-Hermite, Linear, Polynomial, or other mathematical techniques may be used. Also, values associated with the reference signal, Ŷ(k), are used in the mathematical computations discussed above.

Figure 9:
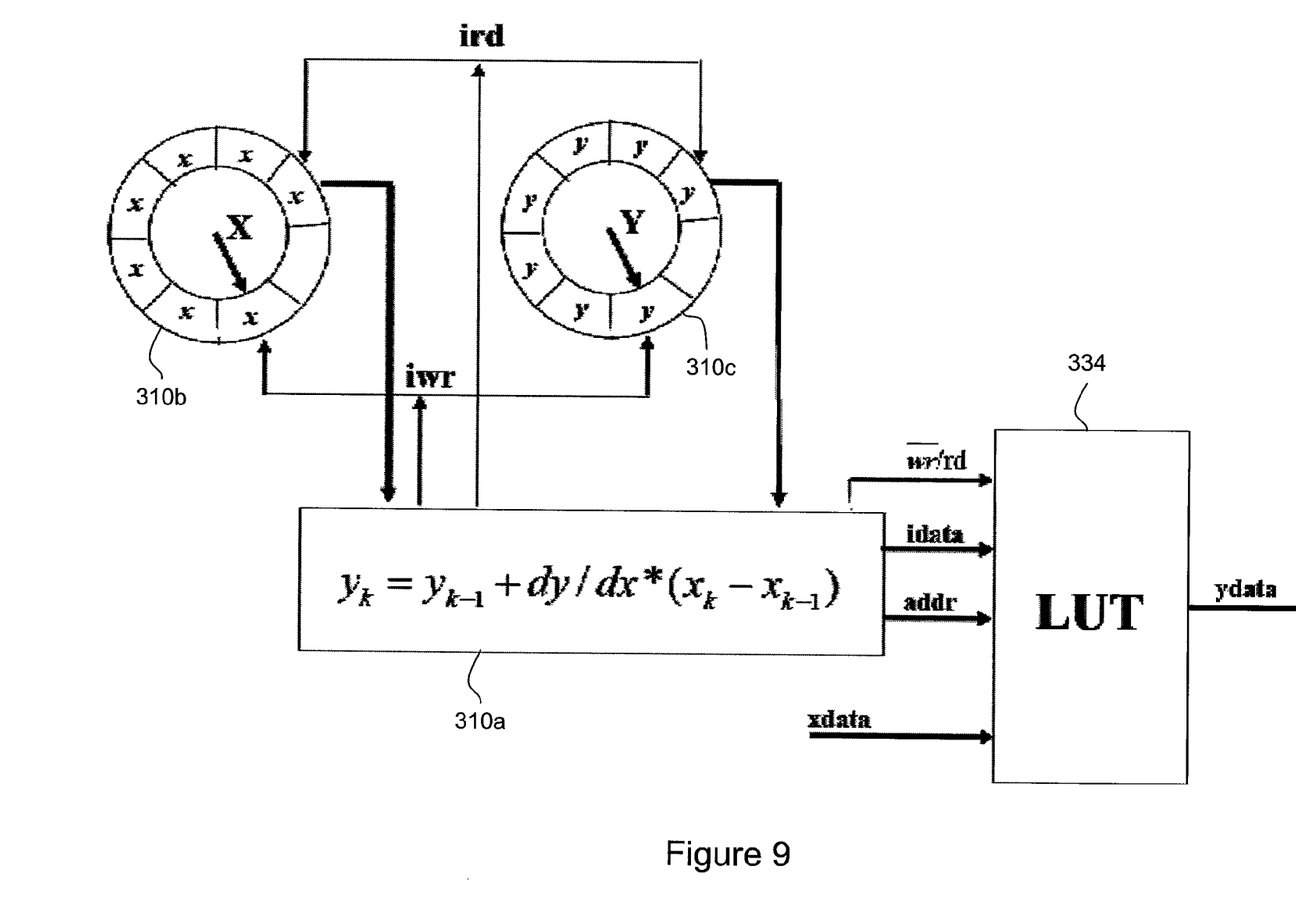
FIG. 9 is a block diagram illustrating an interpolator for use with a digital polar transmitter according to another aspect of the invention.

FIG. 9 is a block diagram of an interpolator 310 and a lookup table 334 for pre-distorting a device input according to another aspect of the invention. The interpolator 310 includes a processor 310a and two circular buffers 310b, 310c. The processor 310a uses signals iwr and ird to control operations for writing to and reading from the circular buffers 310b, 310c. The processor uses signals wr/rd, idata, and addr to control operations for writing to and reading from the lookup table 334. The processor 310a is configured to receive an original device input X (e.g., original baseband amplitude signal 222) and to generate a pre-distorted device input Y (e.g., amplitude correction signal 324) designed to compensate for the nonlinear response of the device (e.g., power amplifier 106). Alternatively, Y may be a pre-distortion parameter used to adjust the original input value X to achieve the desired linear device output. For example, a pre-distortion parameter Y may be an offset that is added to the original input value X, a factor that is multiplied by the original input value X, or any other suitable parameter to adjust the original input value X. The phase interpolator 304 and lookup table 332 shown in FIG. 3 are an example of this approach.

During a calibration period, the processor acquires a set of known data pairs, each pair including an X value and a Y value. For example, the data acquisition may be performed as described above with respect to FIGS. 3 and 7.

The calibration period during which this acquisition of known data pairs takes place may involve processing a specific set of original input values designed to produce a particular set of known data pairs. Alternatively, the processor may leverage a standardized calibration or startup routine to acquire the known data pairs. For example, in a GSM/EDGE implementation, a standard ramp-up period may be used as the calibration period to acquire known data pairs. Because the data acquisition is performed during the closed-loop calibration period based on feedback from the actual device output, the acquired data reflects the current nonlinearity of the transmitter 100 and/or power amplifier 106 at the time of calibration. In addition, the calibration process may be performed periodically to account for changes in the nonlinearity of the transmitter 100 and/or power amplifier 106.

The set of known data pairs acquired during the calibration period may not be complete. There may be data pairs missing from the set. For example, the original input signal 110 processed during the calibration period may not involve every possible original input value. This results in holes in the set of known data pairs. The interpolation processor 310a may be configured to interpolate or extrapolate one or more data values to fill these holes.

To identify missing data values, the processor 310a temporarily stores values of at least some of the known data pairs in the buffers 310b, 310c. As illustrated, the X values may be stored in the first circular buffer 310b, and the Y values may be stored in the second circular buffer 310c. The processor 310a may then sort the known data pairs and search for holes in the data set. For example, the processor 310a may sort the known data pairs in order of their X values. Once a hole has been identified, the processor 310a determines a data value to fill the hole using an interpolation/extrapolation formula. For example, the processor 310a shown in FIG. 8 uses the following equation:

$$y_k = y_{k-1} + dy/dx * (x_k - x_{k-1})$$

Other interpolation/extrapolation formulas also may be used. In this way, the processor 310a augments the set of known data values with interpolated or extrapolated data. The processor 310a stores the augmented set of data pairs in the lookup table 334.

After the calibration period is complete, the values in the lookup table 334 are used to pre-distort the device input. In response to a particular original input data value $x_i$, the corresponding pre-distorted input value $y_i$ (or a pre-distorted input value determined from a pre-distortion factor $y_i$) is provided from the lookup table 334. Because a complete set of Y values has been assembled during the calibration period through collection, interpolation, and/or extrapolation, the lookup table 334 can be used to reliably pre-distort the device input for a desired linear output in an efficient open-loop operating mode. At this point, the digital feedback loop 108 of the transmitter 100 may be disabled and the transmitter 100 operates in an efficient open-loop operational mode. In this mode, the lookup table 334 provides a pre-distorted device input (e.g., amplitude correction signal 324) or a pre-distortion factor, as is the case with phase correction signal 320, through use of the data pairs stored in the lookup table 334. As a result, the transmitter 100 provides the desired linear output.

Figure 10:
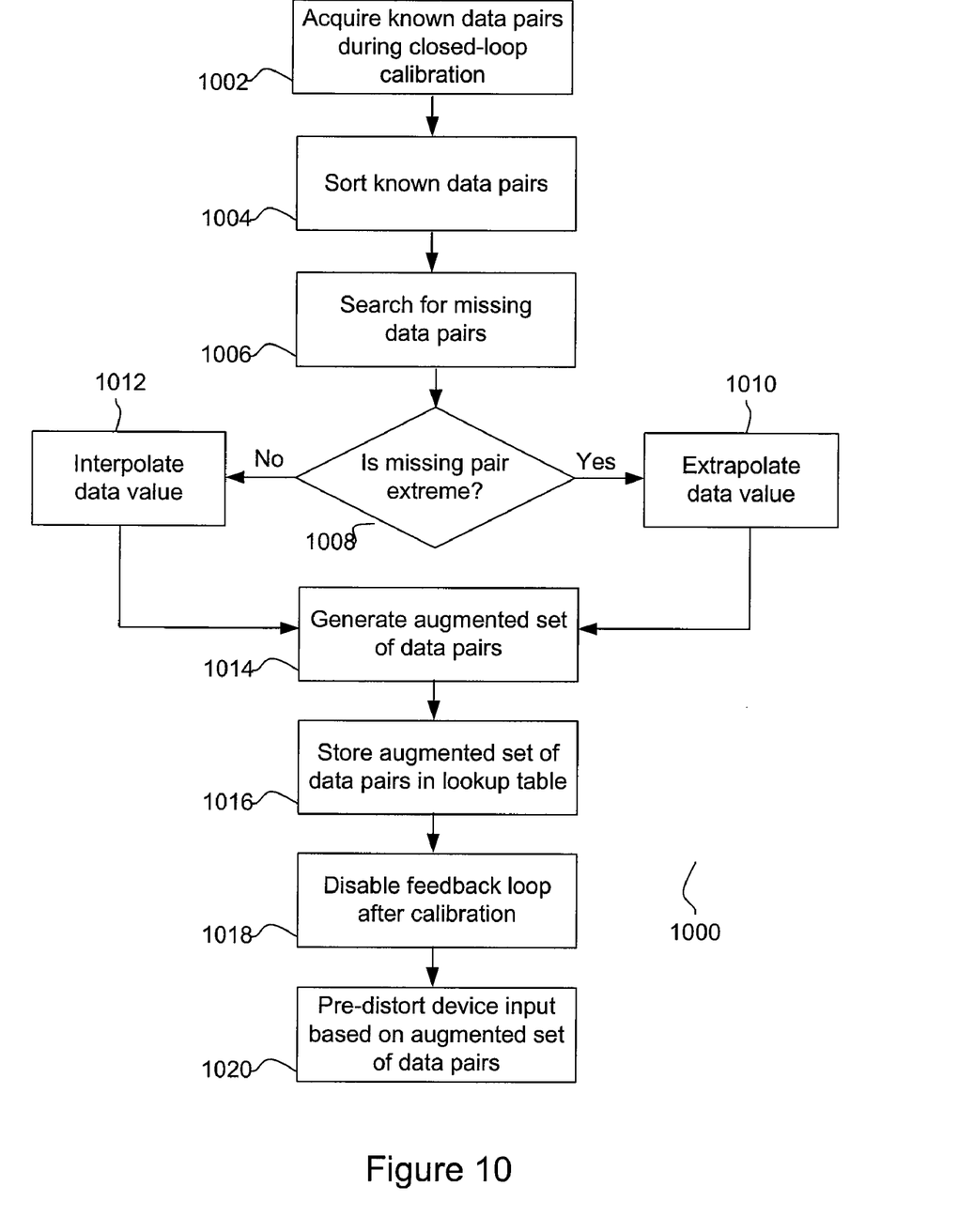
FIG. 10 is a flow diagram illustrating method for pre-distorting an input for use with a digital polar transmitter according to another aspect of the invention.

FIG. 10 is a flow diagram illustrating a method 1000 for pre-distorting a device input according to another aspect of the invention. A set of known data pairs is acquired 1002 during a closed-loop calibration period. For example, known data pairs may be acquired in the manner described above. The known data pairs are then sorted 1004, and a search 1006 is conducted for missing data pairs, also known as holes in the data. When a missing data pair is identified, it is determined 1008 whether or not the missing data pair is an extreme. A missing data pair is an extreme if it falls outside the range of values of known data pairs. If the missing data pair is an extreme, then a data value may be extrapolated 1010 based on the values of known data pairs to fill the hole. If the missing data pair is not an extreme, then a data value is interpolated 1012 based on other known data values to fill the hole. As an alternative, the method 1000 may fill holes in the known data pairs only through interpolation, not extrapolation. In this case, there would be no attempt to fill holes resulting from extreme missing data pairs.

An augmented set of data pairs is generated 1014. The augmented set of data pairs includes the known data pairs and one or more interpolated or extrapolated data values. The augmented set of data pairs is stored 1016 in a lookup table. Once the calibration period is complete, the feedback loop may be disabled 1018 for increased power efficiency. The input of the device (e.g., the baseband amplitude or phase signal) is then pre-distorted 1020 based on the augmented set of data pairs stored in the lookup table.

Figure 11:
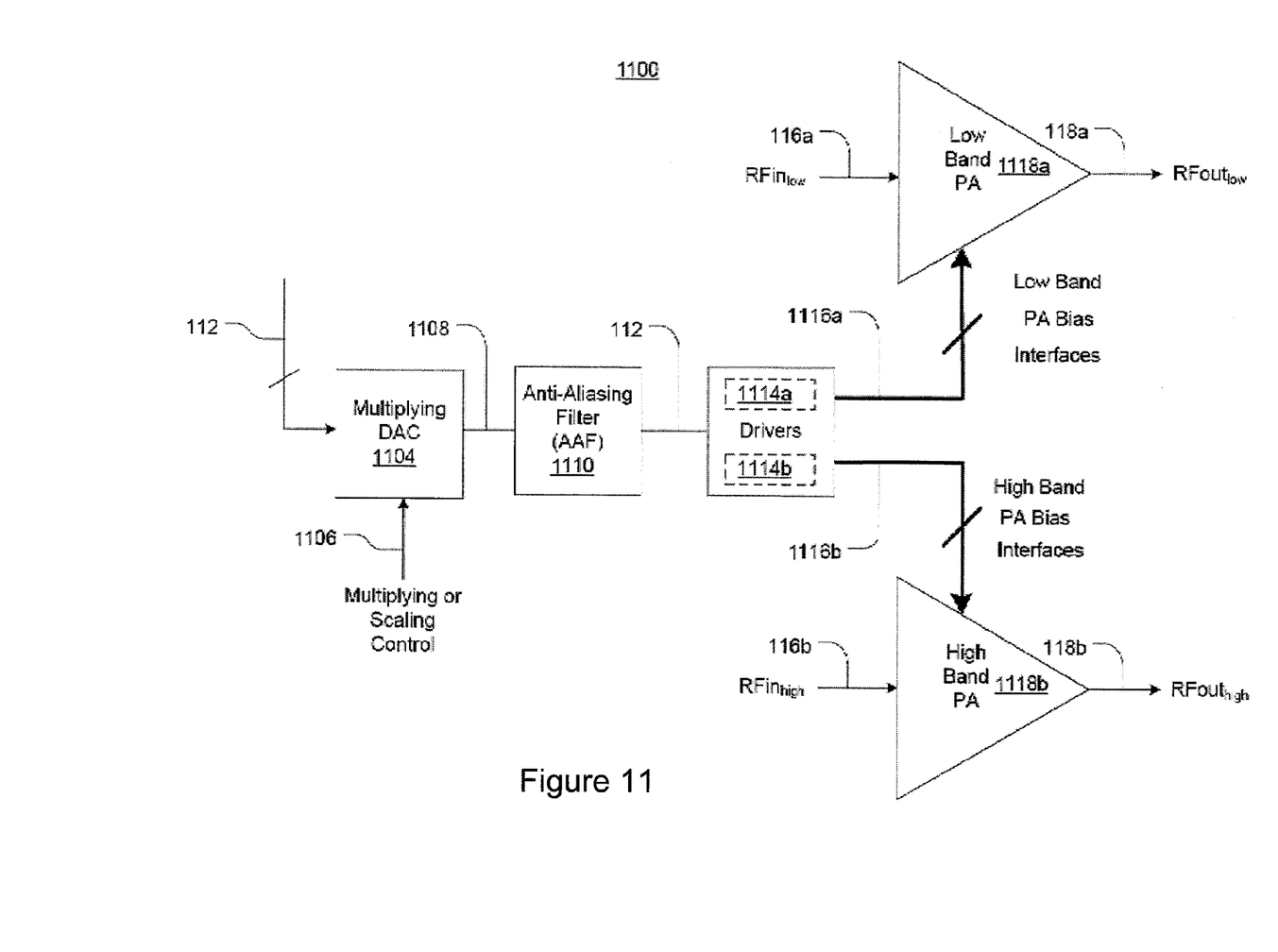
FIG. 11 is a block diagram illustrating a power amplifier module for use with a digital polar transmitter according to another aspect of the invention.

FIG. 11 is a block diagram illustrating a power amplifier module for use with a digital polar transmitter according to another aspect of the invention. Power amplifier module 1100 includes a multiplying digital-to-analog converter (DAC) 1104. The pre-distorted baseband amplitude component 112 is applied to the input ports of multiplying DAC 1104. The pre-distorted baseband amplitude component 112 may comprise 2–M bits, where M represents any suitable number of bits to resolve the amplitude information with a suitable resolution and linearity. A multiplying or scaling control signal 1106 (e.g., from power control module 316) also may be provided to an input port of multiplying DAC 1104.

An analog output signal 1108 from multiplying DAC 1104 may be applied to an anti-aliasing filter (AAF) 1110. The resulting filtered analog amplitude signal 112 is applied to drivers 1114a, 1114b. Either driver 1114a, 1114b, may be selected based on a particular mode (e.g., high band mode or low band mode) of operation of the power amplifier module 1100. Depending on the particular implementation, drivers 1114a, 1114b, each may comprise multiple voltage mode or current mode drivers to drive respective digital power amplifiers 1118a, 1118b. The number may be proportional to the number of amplification stages of power amplifiers 1118a, 1118b. For example, power amplifiers 1118a, 1118b may include P amplification stages biased by P drivers, where P is any number. At least one of the amplification stages may include a transistor device (e.g., an FET or HBT device) to receive a modulated signal at a base terminal thereof. Accordingly, at least one of the drivers 1114a, 1114b may be configured to provide the modulation signal to the base terminal of the output transistor device.

The drivers 1114a, 1114b may be configured to operate in two or more different modes. For example, in GSM/EDGE implementations, drivers 1114a, 1114b may be configured to drive both low band and high band digital power amplifiers. Accordingly, driver 1114a may drive low band power amplifier 1118a bias output signals 1116a, to provide suitable biasing for each amplification stage of low band power amplifier 1118a. In addition, any one of bias output signals 1116a may include an amplitude modulation signal to control the digital envelope to be amplified by power amplifier 1118a. Driver 1114b may drive high band power amplifier 1118b bias output signals 1116b to provide suitable biasing for each amplification stage of power amplifier 1118b. In addition, any one of bias output signals 1116b may include an amplitude modulation signal to control the digital envelope to be amplified by power amplifier 1118b. The amplitude modulation signal may be applied to output amplification stages of power amplifiers 1118a, 1118b. For example, the amplitude modulation signal may be applied to a base terminal of a HBT device in any suitable manner to implement one embodiment of the base modulation techniques previously described. Alternatively, the power amplifiers 1118a, 1118b may be implemented using FET devices.

A low band phase-modulated RF carrier signal 116a RFinlow may be applied to an input port of low band digital power amplifier 1118a. RF input signal 116a RFinlow comprises an RF carrier containing phase modulation information. For example, RF input signal 116a RFinlow may be provided by the phase modulator 104, described above with reference to FIG. 1. A high band phase-modulated RF carrier signal 116b RFinhigh may be applied to an input port of high band digital power amplifier 1118b. RF input signal 116b also may comprise an RF carrier containing phase modulation information, and may be provided by the phase modulator 104 described above. Each power amplifier 1118a, 1118b produces respective amplified RF output signals 118a, 118b. RF output signals 118a, 118b include RF carrier, signal amplitude, and phase information. Power amplifiers 1118a, 1118b are base-modulated in at least one amplification stage to produce output signals 118a, 118b.

Figure 12:
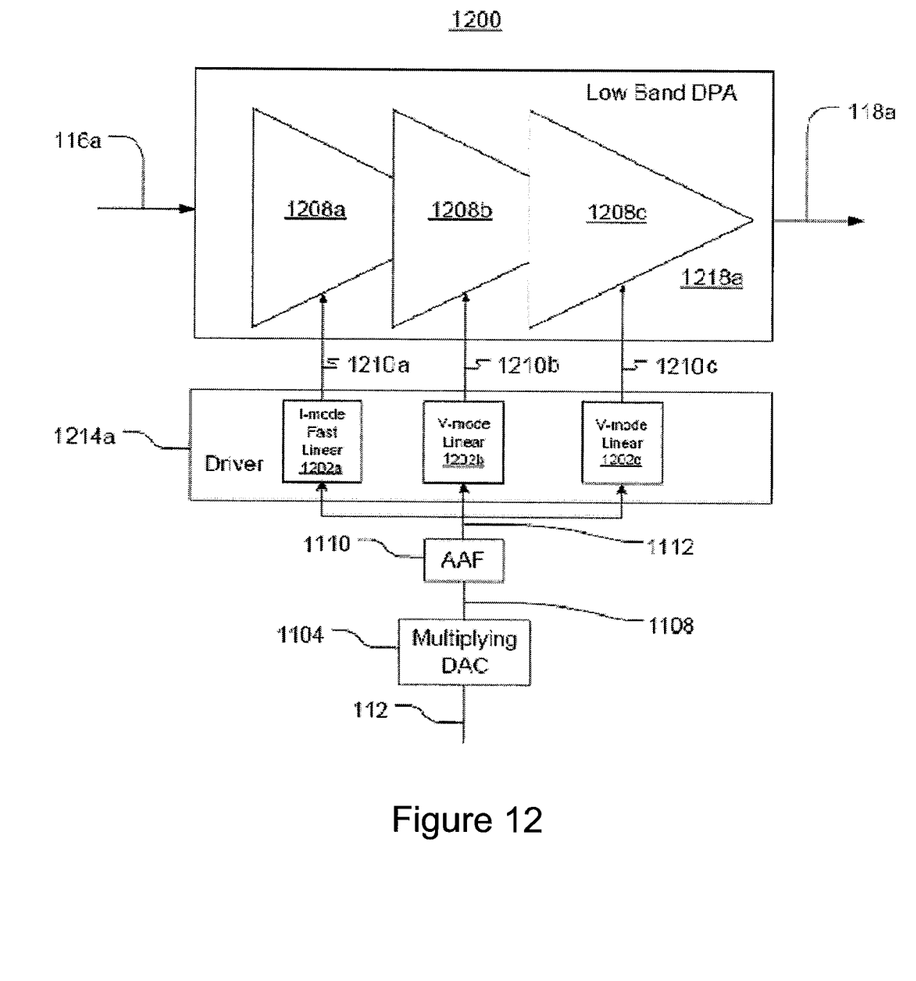
FIG. 12 is a block diagram illustrating a portion of a power amplifier module for use with a digital polar transmitter according to another aspect of the invention.

FIG. 12 is a block diagram illustrating a portion of a power amplifier module for use with a digital polar transmitter according to another aspect of the invention. The power amplifier 1218a includes driver circuit 1214a to drive bias currents and voltages to power amplifier 1218a. Polar amplifier sub-module 1200 is a portion of a multi-mode polar amplifier module, with only the low band digital power amplifier portion is shown. Accordingly, in multi-mode polar amplifier module 1100, power amplifier 1218a may be a low band digital power amplifier. Power amplifier 1218a may be a RF DAC adapted for telecommunications implementations. For example, power amplifier 1218a may be adapted as a low-band RF digital power amplifier for GSM/EDGE implementations. As shown in FIG. 12, power amplifier 1218a comprises three amplification stages including a first amplification stage 1208a, a second amplification stage 1208b, and a third amplification stage 1208c. Low band phase-modulated RF carrier signal 116a RFinlow comprising an RF carrier containing phase modulation information may be applied to an input port of first amplification stage 1208a. Amplified RF output signal 118a may be applied to an antenna or to other amplification stages or circuit elements.

Driver 1214a comprises three bias modules 1202a, 1202b, 1202c to drive respective bias currents or supply voltages 1210a, 1210b, 1210c to bias respective amplification stages 1208a, 1208b, 1208c. Pre-distorted baseband amplitude component 112 may be received from an output port of an AM-AM correction module, such as, for example, baseband processor 102. Multiplying DAC 1104 also may receive multiplying or scaling control signal 1106 at an input port of multiplying DAC 1104. An analog output signal 1108 may be applied to anti-aliasing filter (AAF) 1110. As described above, AAF 1110 smooths out analog signal 1108 output of multiplying DAC 1104 to compensate for the nonlinearity of the third amplification stage 1208c (e.g., the base modulation stage) of power amplifier 1218a. Filtered analog amplitude signal 1112 of AAF 1110 forms the input to each bias module 1202a-c. Bias modules 1202a-c may be configured to operate either in current mode or voltage mode to drive bias current or supply voltage in linear or non-linear (e.g., square) proportions. For example, bias module 1202a may be configured to operate in fast-linear current mode and bias modules 1202b, 1202c may be configured to operate in linear voltage mode. In addition, each bias module 1202a-c may be configured to implement analog shaping functions. At least one of bias modules 1202a-c may be adapted to provide a modulation signal to a base terminal of a transistor in any one of amplification stages 1208a-c to implement a base modulation technique. For example, bias module 1208c may be configured to modulate a power amplifier transistor via a base terminal of the transistor rather than a collector terminal. The amplifier transistor may be formed of GaAs HBT technology, for example, and bias module 1208c may be configured to provide modulation signal 1210c to drive the base terminal of an HBT transistor in third amplification stage 1208c (e.g., the output stage of power amplifier 1218a).

The methods and systems of the present invention may be realized in software, hardware, or a combination of software and hardware. Any type of computing system or other apparatus adapted for realizing the methods described herein is suitable. In the present context, a program may include any expression, in any language, code or notation, of a set of instructions intended to cause a system having an information processing capability to perform a particular function. It is intended that the foregoing detailed description be regarded as illustrative rather than limiting, and that it be understood that the following claims, including all equivalents, are intended to define the scope of this invention.

The invention claimed is:

1. A digital polar transmitter, comprising:
a baseband processor configured to receive an input signal and to convert the input signal into a baseband amplitude component and a baseband phase component;
a phase modulator in communication with the baseband processor, wherein the phase modulator is configured to modulate an RF carrier signal based on the phase component and to generate a phase-modulated RF carrier signal;
a power amplifier in communication with the baseband processor and the phase modulator, wherein the power amplifier is configured to amplify the phase-modulated RF carrier signal based on the baseband amplitude component and to generate an amplified RF signal; and
a digital feedback loop in communication with the power amplifier and the baseband processor, wherein the digital feedback loop is configured to detect the amplified RF signal and the phase-modulated RF carrier signal, and to provide a digital amplitude feedback signal and a digital phase feedback signal to the baseband processor, based upon the amplified RF signal and the phase-modulated RF carrier signal.

2. A digital polar transmitter as in claim 1, wherein the baseband processor further comprises:
a symbol processor configured to receive a plurality of digital data symbols and to process each of the plurality of digital data symbols into a baseband amplitude signal and a baseband phase signal; and
an amplitude/phase processor in communication with the symbol processor and configured to pre-distort the baseband amplitude signal and to pre-distort the baseband phase signal.

3. A digital polar transmitter as in claim 1, wherein the baseband processor further comprises:
a phase predictor configured to operate during a closed-loop calibration period and to provide a closed-loop phase correction signal based on predicted changes in the phase of the amplified RF signal;
a phase correction lookup table configured to store a plurality of phase pre-distortion values and to provide an open-loop phase correction signal based on at least one of the plurality of phase pre-distortion values;
a phase interpolator configured to operate during the closed-loop calibration period and to generate the plurality of phase pre-distortion values; and
a phase synchronizer configured to operate during the closed-loop calibration period and during an open-loop operation period, wherein the phase synchronizer is further configured to pre-distort the baseband phase signal based on the closed-loop phase correction signal during the closed-loop calibration period and to pre-distort the baseband phase signal based on the open-loop phase correction signal during the open-loop operation period.

4. A digital polar transmitter as in claim 1, wherein the baseband processor further comprises:
an amplitude predictor configured to operate during a closed-loop calibration period and to provide a closed-loop amplitude correction signal based on predicted changes in the amplitude of the amplified RF signal;
an amplitude correction lookup table configured to store a plurality of amplitude pre-distortion values and to provide an open-loop amplitude correction signal based on at least one of the plurality of amplitude pre-distortion values;
an amplitude interpolator configured to operate during the closed-loop calibration period and to generate the plurality of amplitude pre-distortion values; and
an amplitude synchronizer configured to operate during the closed-loop calibration period and during an open-loop operation period, wherein the amplitude synchronizer is further configured to pre-distort the baseband amplitude signal based on the closed-loop amplitude correction signal during the closed-loop calibration period and to pre-distort the baseband amplitude signal based on the open-loop amplitude correction signal during the open-loop operation period.

5. A digital polar transmitter as in claim 1, wherein the digital feedback look further comprises:
   a detector configured to convert the amplified RF signal to a pair of digital IQ feedback signals; and
   an IQ to polar converter in communication with the detector and configured to convert the digital IQ feedback signals to the digital amplitude feedback signal and the digital phase feedback signal.

6. A digital polar transmitter as in claim 1, wherein the power amplifier further comprises:
   a plurality of amplifier drivers, wherein each of the plurality of amplifier drivers is configured to generate an amplifier driver amplitude signal based on the baseband amplitude component; and
   a plurality of power amplifier stages, each associated with a respective one of the plurality of amplifier drivers, wherein each of the plurality of power amplifier stages is configured to amplify the phase-modulated RF carrier signal based on a respective one of the amplifier driver amplitude signals.

7. A digital polar transmitter, comprising:
   a baseband processor configured to receive an input signal and to convert the input signal into a baseband amplitude component and a baseband phase component;
   a phase modulator in communication with the baseband processor, wherein the phase modulator is configured to modulate an RF carrier signal based on the phase component and to generate a phase-modulated RF carrier signal;
   a power amplifier in communication with the baseband processor and the phase modulator, wherein the power amplifier is configured to amplify the phase-modulated RF carrier signal based on the baseband amplitude component and to generate an amplified RF signal; and
   a digital feedback loop in communication with the power amplifier and the baseband processor, wherein the digital feedback loop is configured to detect the amplified RF signal and to provide a digital amplitude feedback signal and a digital phase feedback signal to the baseband processor;
   the baseband processor comprising
      a phase predictor configured to operate during a closed-loop calibration period and to provide a closed-loop phase correction signal based on predicted changes in the phase of the amplified RF signal,
      a phase correction lookup table configured to store a plurality of phase pre-distortion values and to provide an open-loop phase correction signal based on at least one of the plurality of phase pre-distortion values,
      a phase interpolator configured to operate during the closed-loop calibration period and to generate the plurality of phase pre-distortion values, and
      a phase synchronizer configured to operate during the closed-loop calibration period and during an open-loop operation period, wherein the phase synchronizer is further configured to pre-distort the baseband phase signal based on the closed-loop phase correction signal during the closed-loop calibration period and to pre-distort the baseband phase signal based on the open-loop phase correction signal during the open-loop operation period.

8. A digital polar transmitter as in claim 7, wherein the digital feedback look further comprises:
   a detector configured to convert the amplified RF signal to a pair of digital IQ feedback signals; and
   an IQ to polar converter in communication with the detector and configured to convert the digital IQ feedback signals to the digital amplitude feedback signal and the digital phase feedback signal.

9. A digital polar transmitter as in claim 7, wherein the power amplifier further comprises:
   a plurality of amplifier drivers, wherein each of the plurality of amplifier drivers is configured to generate an amplifier driver amplitude signal based on the baseband amplitude component; and
   a plurality of power amplifier stages, each associated with a respective one of the plurality of amplifier drivers, wherein each of the plurality of power amplifier stages is configured to amplify the phase-modulated RF carrier signal based on a respective one of the amplifier driver amplitude signals.

10. A digital polar transmitter, comprising:
   a baseband processor configured to receive an input signal and to convert the input signal into a baseband amplitude component and a baseband phase component;
   a phase modulator in communication with the baseband processor, wherein the phase modulator is configured to modulate an RF carrier signal based on the phase component and to generate a phase-modulated RF carrier signal;
   a power amplifier in communication with the baseband processor and the phase modulator, wherein the power amplifier is configured to amplify the phase-modulated RF carrier signal based on the baseband amplitude component and to generate an amplified RF signal; and
   a digital feedback loop in communication with the power amplifier and the baseband processor, wherein the digital feedback loop is configured to detect the amplified RF signal and to provide a digital amplitude feedback signal and a digital phase feedback signal to the baseband processor;
   the baseband processor comprising
      an amplitude predictor configured to operate during a closed-loop calibration period and to provide a closed-loop amplitude correction signal based on predicted changes in the amplitude of the amplified RF signal,
      an amplitude correction lookup table configured to store a plurality of amplitude pre-distortion values and to provide an open-loop amplitude correction signal based on at least one of the plurality of amplitude pre-distortion values,
      an amplitude interpolator configured to operate during the closed-loop calibration period and to generate the plurality of amplitude pre-distortion values, and
      an amplitude synchronizer configured to operate during the closed-loop calibration period and during an open-loop operation period, wherein the amplitude synchronizer is further configured to pre-distort the baseband amplitude signal based on the closed-loop amplitude correction signal during the closed-loop calibration period and to pre-distort the baseband amplitude signal based on the open-loop amplitude correction signal during the open-loop operation period.

11. A digital polar transmitter as in claim 10, wherein the digital feedback look further comprises:
   a detector configured to convert the amplified RF signal to a pair of digital IQ feedback signals; and
   an IQ to polar converter in communication with the detector and configured to convert the digital IQ feedback signals to the digital amplitude feedback signal and the digital phase feedback signal.

12. A digital polar transmitter as in claim 10, wherein the power amplifier further comprises:

a plurality of amplifier drivers, wherein each of the plurality of amplifier drivers is configured to generate an amplifier driver amplitude signal based on the baseband amplitude component; and
a plurality of power amplifier stages, each associated with a respective one of the plurality of amplifier drivers, wherein each of the plurality of power amplifier stages is configured to amplify the phase-modulated RF carrier signal based on a respective one of the amplifier driver amplitude signals.

* * * * *